US008456009B2

(12) United States Patent
Su et al.

(10) Patent No.: US 8,456,009 B2
(45) Date of Patent: Jun. 4, 2013

(54) SEMICONDUCTOR STRUCTURE HAVING AN AIR-GAP REGION AND A METHOD OF MANUFACTURING THE SAME

(75) Inventors: Shu-Hui Su, Tucheng (TW); Cheng-Lin Huang, Hsinchu (TW); Jiing-Feng Yang, Zhubei (TW); Zhen-Cheng Wu, Hsinchu (TW); Ren-Guei Wu, Taoyuan (TW); Dian-Hau Chen, Hsinchu (TW); Yuh-Jier Mii, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 449 days.

(21) Appl. No.: 12/707,969

(22) Filed: Feb. 18, 2010

(65) Prior Publication Data
US 2011/0198757 A1 Aug. 18, 2011

(51) Int. Cl.
*H01L 29/40* (2006.01)

(52) U.S. Cl.
USPC ............ 257/764; 257/774; 257/E21.575; 257/E23.011; 438/619; 438/421; 438/637

(58) Field of Classification Search
USPC ............ 438/421, 619–637; 257/764, 774, 257/E21.575, E23.011, E23.062
See application file for complete search history.

(56) References Cited

U.S. PATENT DOCUMENTS

| | | | | |
|---|---|---|---|---|
| 5,461,003 A | * | 10/1995 | Havemann et al. | 438/666 |
| 5,744,865 A | * | 4/1998 | Jeng et al. | 257/750 |
| 5,798,559 A | * | 8/1998 | Bothra et al. | 257/522 |
| 5,814,558 A | * | 9/1998 | Jeng et al. | 438/623 |
| 5,998,293 A | * | 12/1999 | Dawson et al. | 438/619 |
| 6,017,814 A | * | 1/2000 | Grill et al. | 438/619 |
| 6,057,226 A | * | 5/2000 | Wong | 438/623 |
| 6,064,118 A | * | 5/2000 | Sasaki | 257/758 |
| 6,078,088 A | * | 6/2000 | Buynoski | 257/410 |
| 6,197,680 B1 | * | 3/2001 | Lin et al. | 438/637 |
| 6,204,165 B1 | * | 3/2001 | Ghoshal | 438/619 |
| 6,211,091 B1 | * | 4/2001 | Lien et al. | 438/706 |
| 6,284,675 B1 | * | 9/2001 | Jin et al. | 438/778 |
| 6,509,623 B2 | * | 1/2003 | Zhao | 257/522 |

(Continued)

FOREIGN PATENT DOCUMENTS

| CN | 101431047 | 5/2009 |
|---|---|---|
| TW | 200927980 | 7/2009 |

OTHER PUBLICATIONS

Jeng, Shin-Puu et al., "A Self-Aligned Air Gap Process", IEDM 2007, pp. 1-3, TSMC, Hsinchu, TW, R.O.C.

(Continued)

*Primary Examiner* — Kyoung Lee
*Assistant Examiner* — Ankush Singal
(74) *Attorney, Agent, or Firm* — Lowe Hauptman Ham & Berner, LLP

(57) ABSTRACT

A semiconductor structure includes a first metal-containing layer, a dielectric capping layer, a second metal-containing layer, and a conductive pad. The first metal-containing layer includes a set of metal structures, a dielectric filler disposed to occupy a portion of the first metal-containing layer, and an air-gap region defined by at least the set of metal structures and the dielectric filler and abutting at least a portion of the set of metal structures. The second metal-containing layer includes at least a via plug electrically connected to a portion of the set of metal structures. The conductive pad and the via plug do not overlap the air-gap region.

20 Claims, 11 Drawing Sheets

U.S. PATENT DOCUMENTS

| | | | |
|---|---|---|---|
| 6,524,948 B2* | 2/2003 | Tamaoka et al. | 438/637 |
| 6,780,753 B2* | 8/2004 | Latchford et al. | 438/619 |
| 6,815,329 B2* | 11/2004 | Babich et al. | 438/619 |
| 6,867,125 B2* | 3/2005 | Kloster et al. | 438/618 |
| 6,903,461 B2* | 6/2005 | Kloster et al. | 257/759 |
| 6,908,829 B2* | 6/2005 | Hussein et al. | 438/421 |
| 7,138,329 B2* | 11/2006 | Lur et al. | 438/619 |
| 7,172,980 B2* | 2/2007 | Torres et al. | 438/783 |
| 7,361,991 B2* | 4/2008 | Saenger et al. | 257/750 |
| 7,649,239 B2* | 1/2010 | Hussein et al. | 257/522 |
| 7,666,753 B2* | 2/2010 | Bonilla et al. | 438/421 |
| 7,666,754 B2* | 2/2010 | Toma et al. | 438/422 |
| 7,754,601 B2* | 7/2010 | Chen et al. | 438/637 |
| 7,759,243 B2* | 7/2010 | Ding et al. | 438/622 |
| 7,772,702 B2* | 8/2010 | Bielefeld et al. | 257/758 |
| 7,902,068 B2* | 3/2011 | Watanabe et al. | 438/637 |
| 8,026,165 B2* | 9/2011 | Zenasni | 438/619 |
| 8,110,879 B2* | 2/2012 | Torres et al. | 257/396 |
| 8,232,653 B2* | 7/2012 | Lee | 257/774 |
| 8,298,911 B2* | 10/2012 | Lee | 438/421 |
| 2002/0016058 A1* | 2/2002 | Zhao | 438/619 |
| 2002/0089060 A1* | 7/2002 | Morisaki et al. | 257/758 |
| 2003/0077893 A1* | 4/2003 | Demolliens et al. | 438/622 |
| 2003/0224591 A1* | 12/2003 | Latchford et al. | 438/619 |
| 2004/0051131 A1* | 3/2004 | Miyajima | 257/306 |
| 2004/0087133 A1* | 5/2004 | Kumar | 438/618 |
| 2004/0097065 A1* | 5/2004 | Lur et al. | 438/619 |
| 2004/0147106 A1* | 7/2004 | Okada | 438/619 |
| 2004/0214427 A1* | 10/2004 | Kloster et al. | 438/637 |
| 2004/0229454 A1* | 11/2004 | Torres et al. | 438/622 |
| 2005/0037604 A1* | 2/2005 | Babich et al. | 438/619 |
| 2005/0070088 A1* | 3/2005 | Lu | 438/624 |
| 2005/0074961 A1* | 4/2005 | Beyer et al. | 438/619 |
| 2005/0151256 A1* | 7/2005 | Natzle | 257/750 |
| 2005/0221600 A1* | 10/2005 | Daamen et al. | 438/622 |
| 2006/0030128 A1* | 2/2006 | Bu et al. | 438/462 |
| 2006/0057835 A1* | 3/2006 | Anderson et al. | 438/619 |
| 2006/0246681 A1* | 11/2006 | Li et al. | 438/421 |
| 2006/0267208 A1* | 11/2006 | Colburn et al. | 257/774 |
| 2006/0281298 A1* | 12/2006 | Noguchi et al. | 438/622 |
| 2006/0292711 A1* | 12/2006 | Su et al. | 438/14 |
| 2007/0035032 A1* | 2/2007 | Tsumura et al. | 257/775 |
| 2007/0035816 A1* | 2/2007 | Daamen et al. | 359/360 |
| 2008/0164541 A1* | 7/2008 | Segal et al. | 257/414 |
| 2008/0169542 A1* | 7/2008 | Suzuki et al. | 257/684 |
| 2008/0174017 A1* | 7/2008 | Yang et al. | 257/751 |
| 2008/0179753 A1* | 7/2008 | Won et al. | 257/773 |
| 2008/0182403 A1* | 7/2008 | Noori et al. | 438/618 |
| 2008/0296775 A1* | 12/2008 | Matsunaga et al. | 257/773 |
| 2008/0299763 A1* | 12/2008 | Ueki et al. | 438/627 |
| 2009/0065946 A1* | 3/2009 | Kojima | 257/773 |
| 2009/0093100 A1* | 4/2009 | Xia et al. | 438/421 |
| 2009/0093112 A1* | 4/2009 | Al-Bayati et al. | 438/618 |
| 2009/0130863 A1* | 5/2009 | Toma et al. | 438/795 |
| 2009/0142919 A1* | 6/2009 | Noguchi et al. | 438/633 |
| 2009/0174067 A1* | 7/2009 | Lin | 257/734 |
| 2009/0200636 A1* | 8/2009 | Edelstein et al. | 257/522 |
| 2009/0243108 A1* | 10/2009 | Gosset et al. | 257/758 |
| 2009/0263951 A1* | 10/2009 | Shibata et al. | 438/422 |
| 2009/0280638 A1* | 11/2009 | Zenasni | 438/619 |
| 2009/0302475 A1* | 12/2009 | Korogi et al. | 257/761 |
| 2010/0001409 A1* | 1/2010 | Humbert et al. | 257/774 |
| 2010/0130001 A1* | 5/2010 | Noguchi | 438/627 |
| 2011/0108992 A1* | 5/2011 | Chanda et al. | 257/773 |
| 2011/0309430 A1* | 12/2011 | Purayath et al. | 257/321 |

OTHER PUBLICATIONS

Chen, Hsien-Wei et al., "A Self-Aligned Air Gap Interconnect Process", IITC 2008, pp. 34-36, TSMC, Hsinchu, TW, R.O.C.
Chen, Hsien-Wei et al., "A Self-Aligned Airgap Interconnect Scheme", IITC 2009, pp. 1-3, TSMC, Hsinchu, TW, R. O.C.
Office Action dated Jun. 4, 2012 from corresponding application No. CN201010540003.6.

\* cited by examiner

SEMICONDUCTOR STRUCTURE HAVING AN AIR-GAP REGION AND A METHOD OF MANUFACTURING THE SAME

BACKGROUND

One or more embodiments of the present invention relates generally to integrated circuits, and more particularly to a semiconductor structure having an air-gap region and a method of manufacturing the same.

Semiconductor manufacturing process is typically separated into two major stages: a front-end process stage and a back-end-of-line (BEOL) process stage. The front-end process refers to the formation of electric devices, such as transistors, and/or electric components, such as resistors and capacitors, on a semiconductor substrate. On the other hand, the back-end-of-line process refers to the formation of metal interconnections between various electric devices and electric components in order to implement a circuitry as designed. Usually, layers of the metal interconnections are insulated by insulating dielectric materials, such as silicon oxide or silicate glass.

As a rule, when the density of structures and electric components on an integrated chip (IC) increases and sizes of the structures and electric components decrease, parasitic capacitances between conductive elements increase. These increased parasitic capacitances further impact transmission of electric signals in the IC by increasing power consumption and resistive-capacitive (RC) time constants. To ease the above-mentioned effects, metals with lower resistance, such as copper, are used to form the metal interconnections. Low dielectric constant (low-k) materials, which have dielectric constants lower than that of silicon oxide or silicate glass, have been developed and utilized as fillers disposed between the conductive elements. In addition to using low-k materials, pores are often formed within the fillers to further decrease the effective dielectric constant (k) value because air has a dielectric constant very close to vacuum, i.e. slightly above 1.

A variation of this porous material concept is to form air gaps within dielectric fillers in order to further reduce the effective dielectric constant value of the semiconductor structure. However, air gaps tend to raise concerns regarding electric or structural integrities of the IC, such as malfunction of the IC due to a later-formed via plug inadvertently landing on one of the air gaps, or delimitation or cracking of the IC due to pressures it suffers during a subsequent bonding or packaging process. The usage of air gaps may also cause other concerns such as thermal conductivity issues and etch-stop layer buckling.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

The making and using of illustrative embodiments are discussed in detail below. It should be appreciated, however, that the present disclosure provides many applicable concepts that can be embodied in a wide variety of specific contexts. The specific embodiments discussed are merely illustrative, and do not limit the scope of the disclosure. A skilled person will appreciate alternative implementations.

As mentioned above, it is very important to reduce the parasitic capacitances among the metal interconnections. In some instances, a one percent decrease in the parasitic capacitances means a 0.6% increase in operating speed for a logic IC manufactured using 22 nanometer manufacturing technology.

FIGS. 1A through 1G are cross-sectional views of a semiconductor structure depicting a method of manufacturing the semiconductor structure having an air-gap region according to a related method.

Figure 1A:
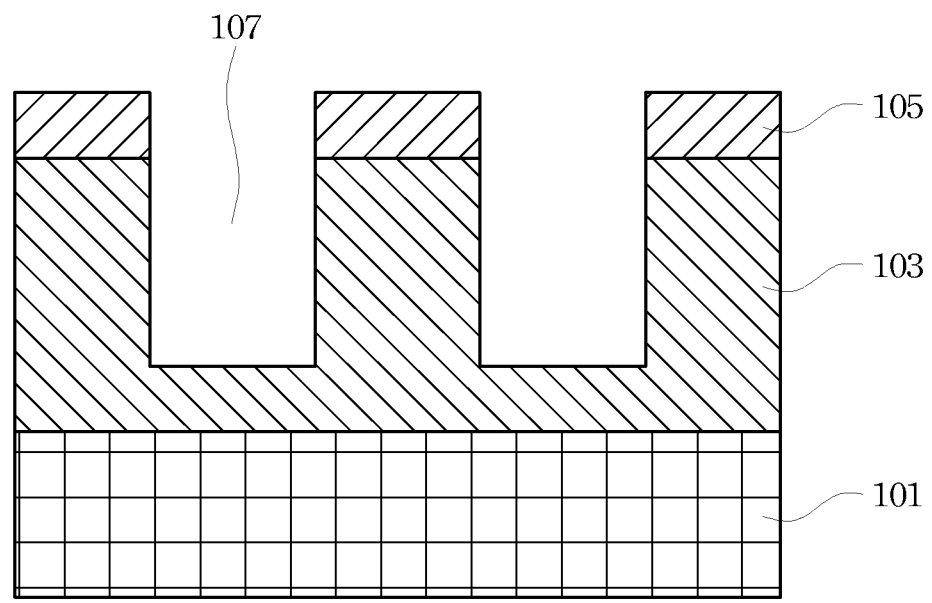
FIGS. 1A through 1G are cross-sectional views of a semiconductor structure depicting a method of manufacturing the semiconductor structure having an air-gap region according to a related method.

Referring to FIG. 1A, a partially fabricated integrated circuit includes a substrate 101 where various electric devices and components are formed thereon. In some embodiments, the devices and components are those manufactured during a front-end process stage or a BEOL process stage. On top of the substrate 101, a dielectric layer 103 is formed. The dielectric layer 103 is a dielectric filler that includes silicon oxide. In other embodiments, the dielectric layer 103 includes other types of materials such as silicon oxide, a low-k material, or an extreme low-k material, where the low-k material is a material with a dielectric constant lower than 3.0, and the extreme low-k material is a material with a dielectric constant lower than 2.5. For example, the low-k dielectric material can be carbon-containing dielectric materials, and may further contain nitrogen, hydrogen, oxygen, and combinations thereof. In some embodiments, a porous structure is used in order to lower the effective dielectric constant of the dielectric layer 103. The preferred thickness of the dielectric layer 103 is between 1000 Å and 3500 Å. One skilled in the art will realize, however, that the dimensions recited throughout the description are related to the technology used for forming the integrated circuits, and are subject to further adjustment with the down-scaling of the technology.

Figure 1B:
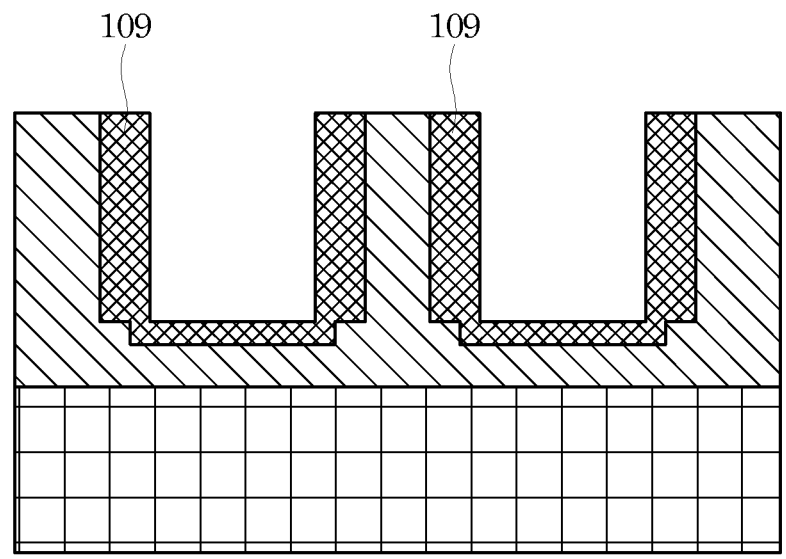

Further, a photoresist layer 105 is formed by depositing a photoresist material on the dielectric layer 103. The photoresist layer 105 is exposed via a photomask to pattern trenches (or vias) 107 to be formed later, and portions of the photoresist layer 105 and the dielectric layer are etched away to form the trenches 107. Referring to FIG. 1B, during the formation of trenches 107, a portion of the dielectric layer 103 is damaged by the etching/ashing process or plasma process and becomes a damaged region 109. In one embodiment, the dielectric material in the dielectric layer 103 includes Si—O—CH3 terminals, and the etching and ashing processes convert it into O—H terminals. In one embodiment, the damaged region 109 includes a portion of a bottom and sidewalls of the trenches 107 with a thickness of about 10 Å to about 300 Å at the bottom and 10 Å to about 300 Å on the sidewalls.

Figure 1C:
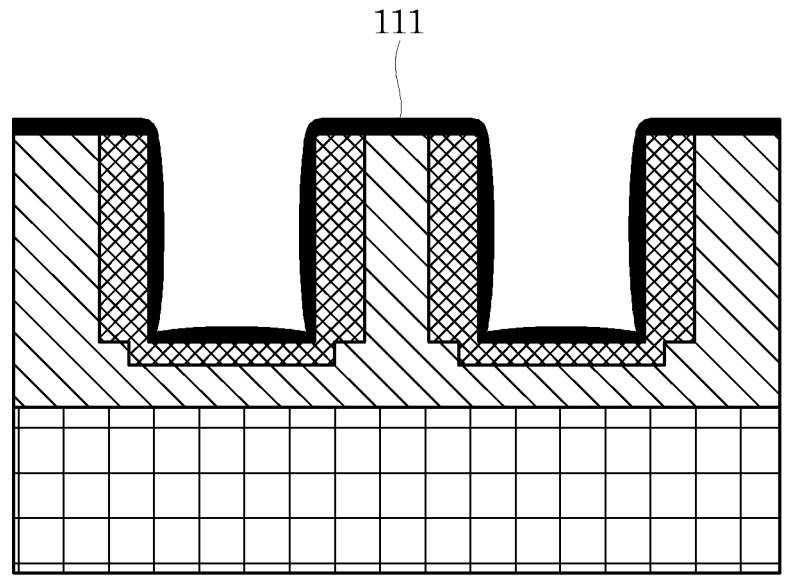

Referring to FIG. 1C, a protective layer 111 is deposited over the damaged region 109 and the trenches 107. The protective layer 111 is generally thinner than the damaged region 109. In one embodiment, the thickness of the protective layer 111 is about 50-150 nm. As shown in FIG. 1C, in some embodiments, depending on the deposition process used, the protective layer 111 is not formed uniformly.

Figure 1D:
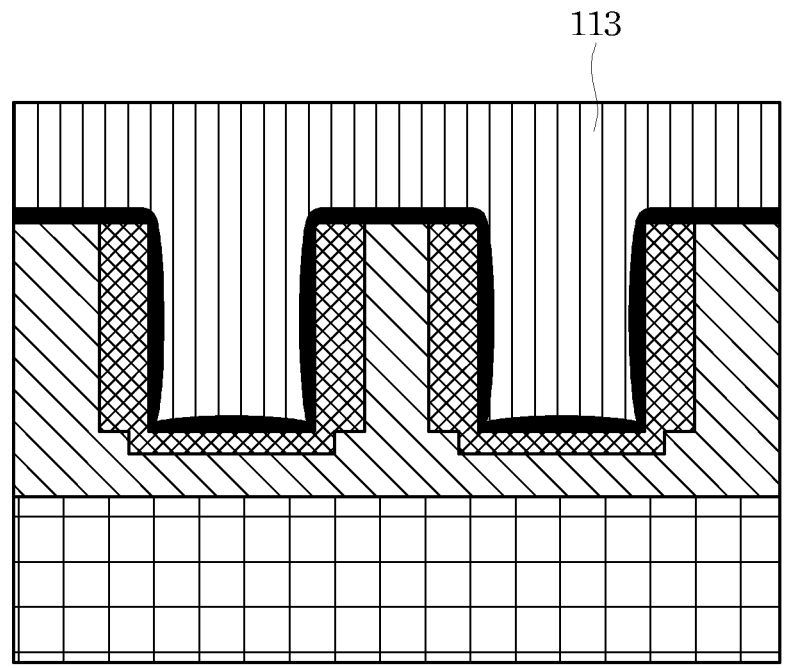
Figure 1E:
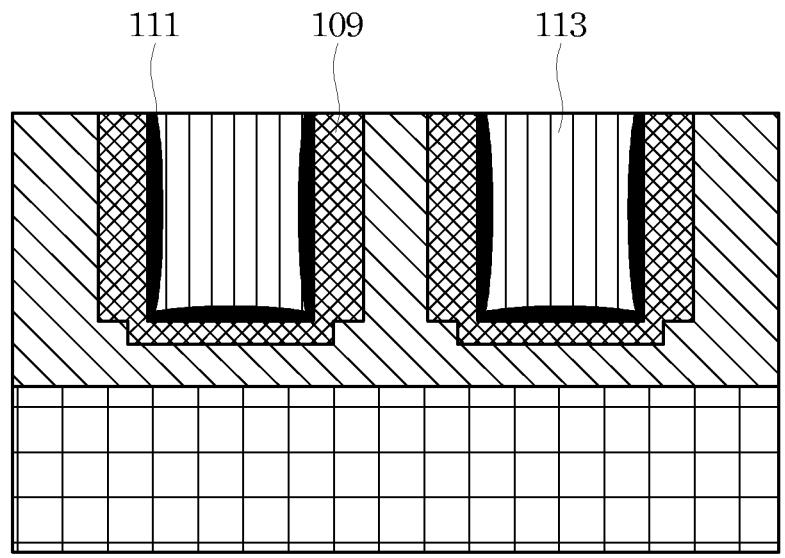
Figure 1F:
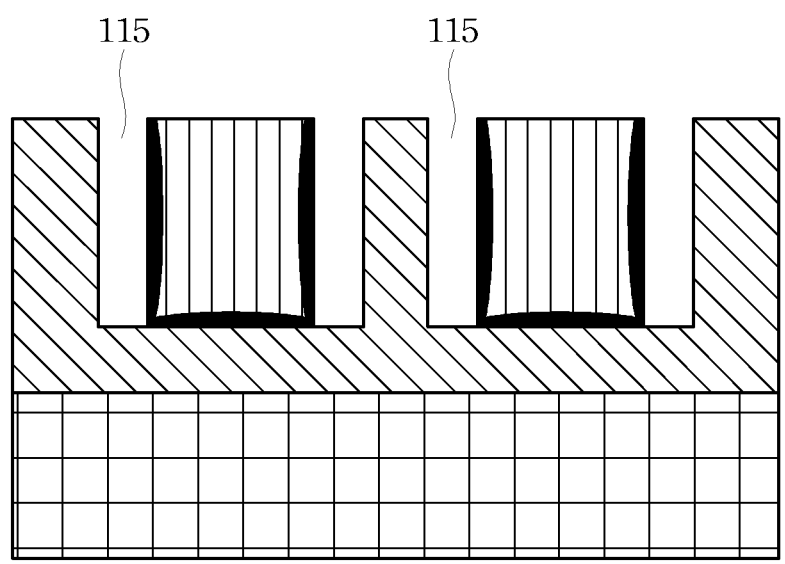
Figure 1G:
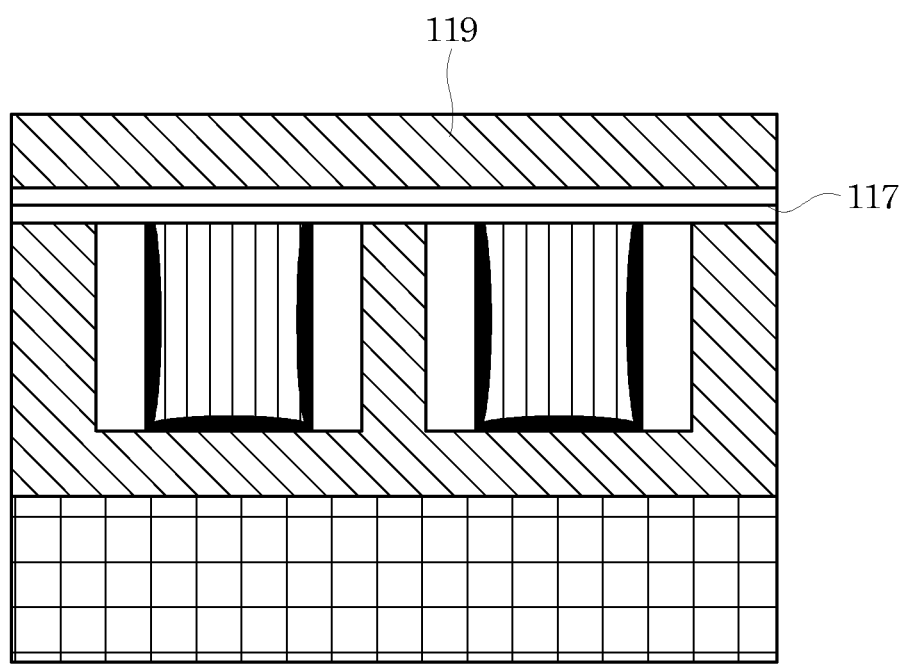

Referring to FIG. 1D, after the protective layer 111 is formed, metal lines (or via plugs) 113 are deposited on top to completely fill the trenches 107. Then as depicted in FIG. 1E, the partially fabricated IC is planarized to reveal a portion of the damaged region 109. Because the damaged region 109 is formed such that it has a different etch selectivity during an etch process in comparison with the etch selectivity of the protective layer 111 and the dielectric layer 103 surrounding the damaged region 109, the damaged region 109 is selectively removed by the etch process, as depicted in FIG. 1F, to form an air-gap region 115. In one embodiment, dilute HF wet etching technology is used. One skilled in the art may be able to alter the processes and materials used based on the disclosure, where the damaged region 109 is more selective over the dielectric layer 103 for another type of etching process. Referring to FIG. 1G, after the air-gap region 115 is formed, an etch-stop layer (ESL) 117 is deposited to seal the air-gap region 115 in the partially fabricated IC. Further, another dielectric layer 119 is formed above the ESL 117.

After interconnection structure is completely formed, during a packaging process, electric connections for connecting the interconnection structure with external circuitries are formed by bonding electric pads on the IC with electric connectors on a package. While bonding, heat and pressure are often applied to the IC, and the application of heat and pressure during the packaging process increases stress and strain on the IC, especially areas directly below the electric pads and their proximity. Moreover, the use of low-k materials in the interconnection structure can weaken the mechanical integrity of the IC to the stress and strain of packaging because low-k materials are, in general, mechanically weaker than non-low-k dielectric materials. This mechanical disadvantage may be exacerbated when a via plug is inadvertently placed in an air-gap region.

Figure 2:
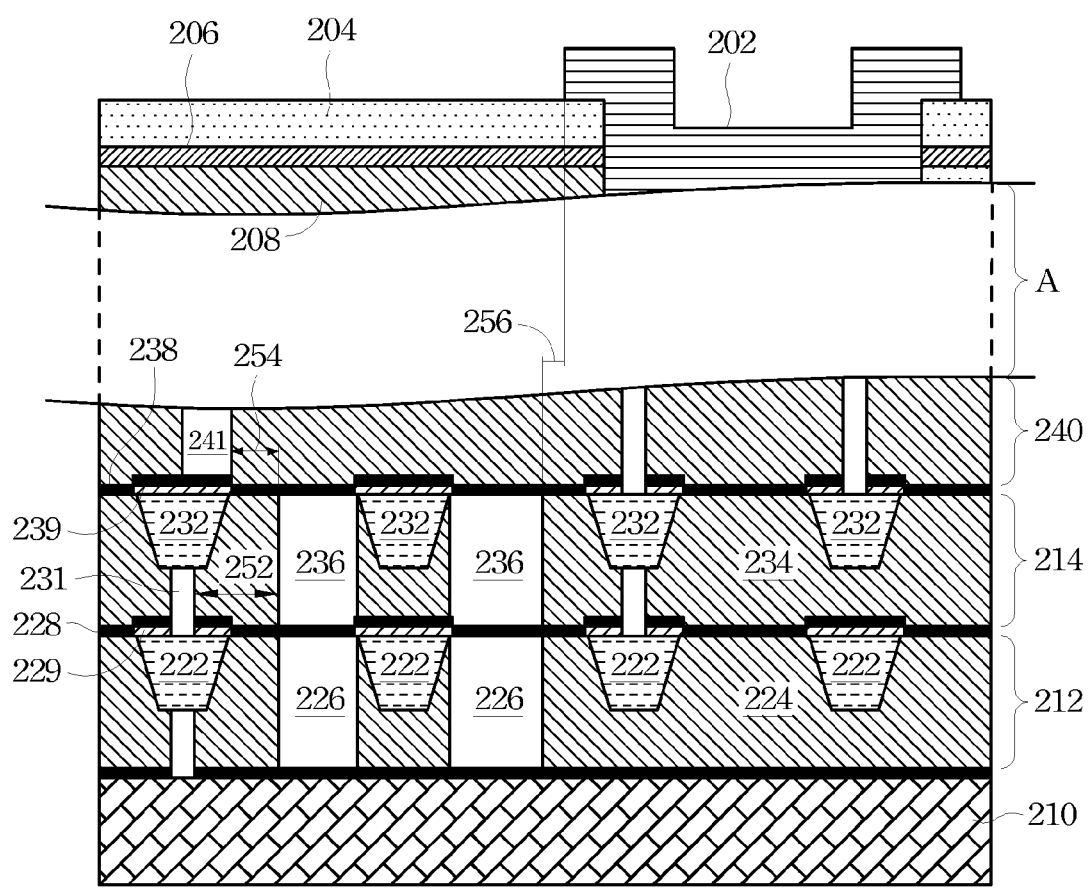
FIG. 2 is a cross-sectional view of a semiconductor structure having an air-gap region according to an embodiment.

FIG. 2 is cross-sectional view of a semiconductor structure having an air-gap region according to an embodiment. The semiconductor structure 200 includes a conductive pad 202, passivation layers 204 and 206, a diffusion barrier layer 208, a semiconductor substrate 210, and a plurality of metal-containing layers 212 and 214. In FIG. 2, only two exemplary metal-containing layers 212 and 214 are shown. However, in some embodiments, more or fewer metal-containing layers may be used. Further, the intervening region A may contain one or more metal-containing layers and/or other structures, but are omitted for simplicity and better clarity of the present disclosure.

The semiconductor substrate 210 has electric devices and components formed thereon (not shown). The passivation layers 204 and 206 and the barrier layer 208 are used to protect interconnections and electric devices/components thereunder from direct exposure to factors, such as humidity and/or certain chemical compounds, that are hazardous to the IC. A bonding bump (not shown) is formed on top of the conductive pad 202 to electrically connect at least one electric component on the semiconductor substrate 210 to a package encapsulating the semiconductor substrate 210.

The metal-containing layer 212 includes a set of metal structures 222 forming conducting paths for the semiconductor structure 200. The metal-containing layer 202 also includes a dielectric filler 224 disposed to occupy a portion of the metal-containing layer 212. In some embodiments, the dielectric filler 224 includes a low-k material or an extreme low-k material. An air-gap region 226 is defined by at least the set of metal structures 222 and the dielectric filler 224. Without using the protective layer 111 depicted in FIG. 1G, the air-gap region 226 abuts at least a portion of the set of metal structures 222. In at least one embodiment, the air-gap region 226 is first occupied by a decomposable filler, for example, a thermally decomposable polymer (TDP) filler, which is subsequently removed by decomposition, for example, by heat that cause decomposition of the TDP filler. The following description discloses using a TDP filler as the decomposable filler; however, other materials having decomposition modes other than heating may be suitable.

Further, a dielectric capping layer 228 is formed over the metal-containing layer 212 to cover the metal structures 222, the dielectric filler 224, and the air-gap region 226. Because dielectric capping layer 228 is formed over the TDP filler in an intermediate stage, a bottom surface of the dielectric capping layer 228 over the air-gap regions 226 is substantially flat. In some embodiments, the dielectric capping layer 228 has a thickness between 5 nm and 50 nm in order to allow the decomposed TDP filler to escape from the semiconductor structure 200. A metal capping layer 229 is formed between the set of metal structures 222 and the dielectric capping layer 228. In some embodiments, it is not necessary to have the metal capping layer 229; in other embodiments, the metal capping layer 229 is made of cobalt tungsten phosphide (CoWP), other cobalt alloys, and materials such as Ru, Rh, Pd, Hf, Ta, Ti, W, Fe, Co, Ni, Al, Nb, AlCu, P, and their compounds including nitride and oxynitride group.

The metal-containing layer 214 is formed over the dielectric capping layer 228 and includes a set of metal structures 232 forming conducting paths for the semiconductor structure 200. In addition, the metal-containing layer 214 includes two via plugs 231 electrically connected to a portion of the set of metal structures 222 of the metal-containing layer 212. In some embodiments, the number of via plugs 231 can be more or fewer than two. Further, similar to the structure of the metal-containing layer 212, the metal-containing layer 214 also includes a dielectric filler 234 disposed to occupy a portion of the metal-containing layer 214, an air-gap region 236 defined by at least the set of metal structures 232 and the dielectric filler 234, dielectric capping layer 238 formed over the over the metal-containing layer 214, and a metal capping layer 239 formed between the set of metal structures 232 and the dielectric capping layer 238. In addition, a dielectric layer 240 is formed over the dielectric capping layer 238, and at least one via plug 241 is formed therein to be electrically connected to a portion of the set of metal structures 232.

Although the air-gap regions 226 and 236 are shown as if one is on top of the other, they are not necessary to be so in an actual structure, depending on the location of other components and metal structures. Further, in some embodiments, not all metal-containing layers 212 and 214 include the air-gap regions 226 and 236.

The via plugs 231 and 241 are designed not to overlap the air-gap regions 226 and 236 of the metal-containing layers 212 and 214 that are immediately below via plugs 231 and 241 to prevent applying additional stress or strain on the air-gap regions 226 and 236. Considering mismatch of layers during manufacturing processes, it is preferable that the via plug 231 and the air-gap region 226 are designed to be separated by at least a minimum horizontal distance 252. In one embodiment, the minimum horizontal distance 252 is 25 nm. In some embodiments, the minimum horizontal distance 252 can be as low as 0 nm and up to 50 nm. Similarly, the via plug 241 and the air-gap region 236 are designed to be separated by at least a minimum horizontal distance 254 between 0 nm and 50 nm, for example.

Also, it is preferable that the conductive pad 202 does not overlap the air-gap regions 226 and 236. Considering mismatch of layers during manufacturing processes, it is preferable that the conductive pad 202 and the air-gap regions 226 and 236 are designed to be separated by at least a minimum horizontal distance 256. In one embodiment, the minimum horizontal distance 256 is 10 μm. In some embodiments, the minimum horizontal distance 256 is between 10 nm and 20 μm.

Figure 3A:
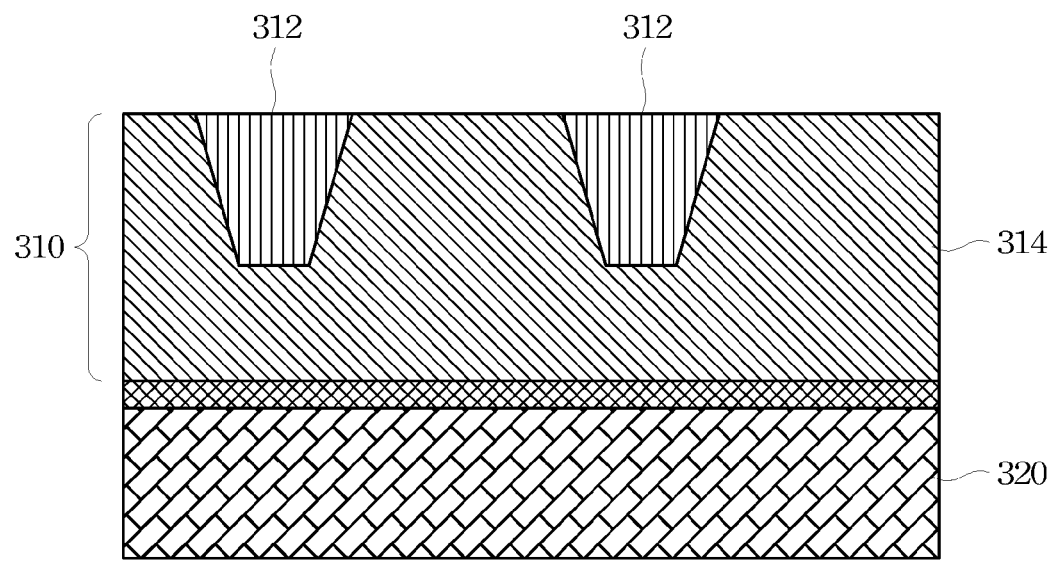
FIGS. 3A through 3F are cross-sectional views of a semiconductor structure depicting a method of manufacturing the semiconductor structure having an air-gap region according to an embodiment.
Figure 3B:
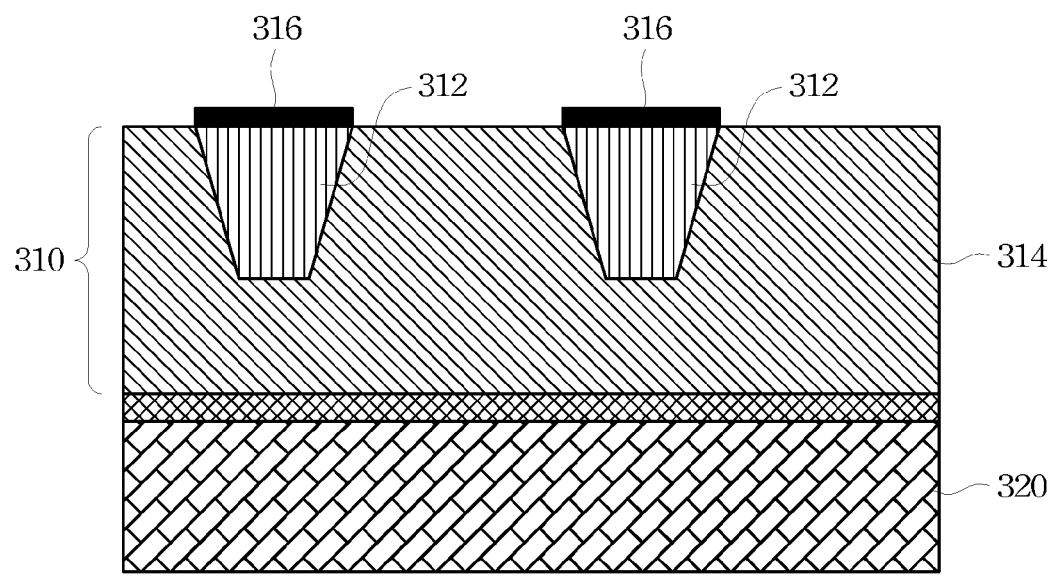

FIGS. 3A through 3F are cross-sectional views of a semiconductor structure depicting a method of manufacturing the semiconductor structure having an air-gap region according to an embodiment. FIG. 3A depicts a metal containing layer 310 formed over a semiconductor substrate 320. The metal containing layer 310 includes a set of metal structures 312 and a dielectric filler 314. Referring to FIG. 3B, a metal capping layer 316 is selectively formed on the set of metal structures 312 of the first metal-containing layer 310. In one embodiment, the metal capping layer 316 is deposited on the set of metal structures 312. Various deposition techniques can be used, including electroless plating, electroplating, PVD, and various types of CVD processes.

Figure 3C:
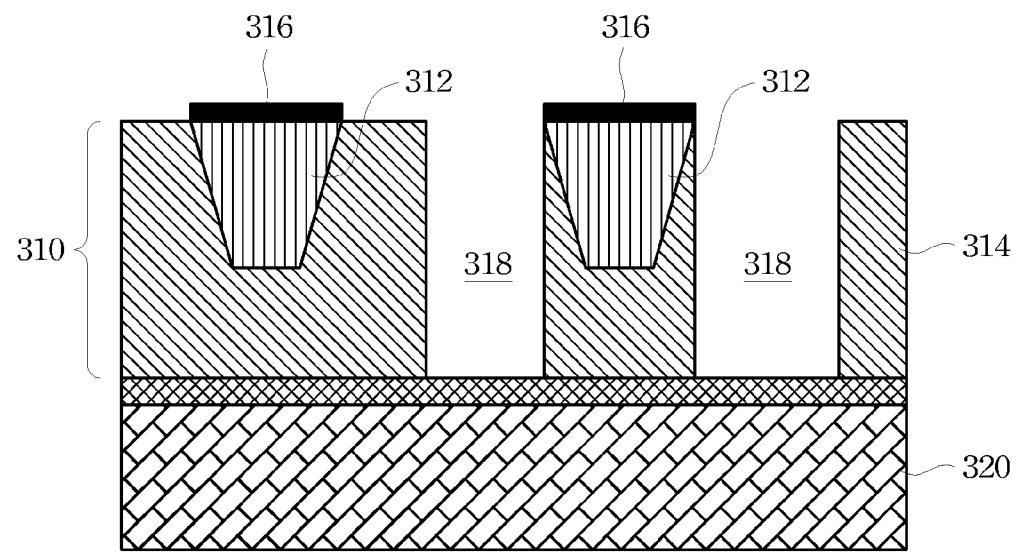
Figure 3D:
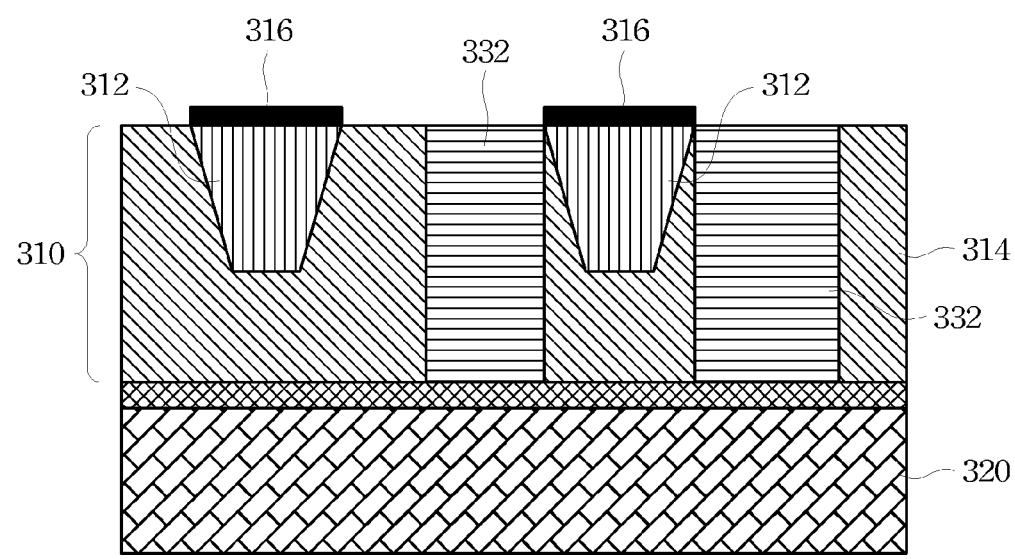

In FIG. 3C, a portion of a dielectric filler 314 is removed from the metal-containing layer 310 to define an air-gap region 318 according to a predetermined air-gap pattern. In one embodiment, the air-gap region 318 is formed by etching the dielectric filler 314. Various known etching methods can be used. In some embodiments, anisotropic processes are preferred. In FIG. 3D, the air-gap region 318 is filled with a decomposable filler such as a thermally decomposable polymer (TDP) filler 332. TDP refers to thermal-degradable polymer or thermally decomposable polymer. In general, a TDP material decomposes into a gaseous state when the temperature of the TDP exceeds the decomposition temperature of the TDP. In some embodiments, the air-gap region 318 is filled by performing a spin coating of a TDP material on the semiconductor substrate 320, curing the TDP material, and planarizing the TDP material to remove excessive TDP material.

Figure 3E:
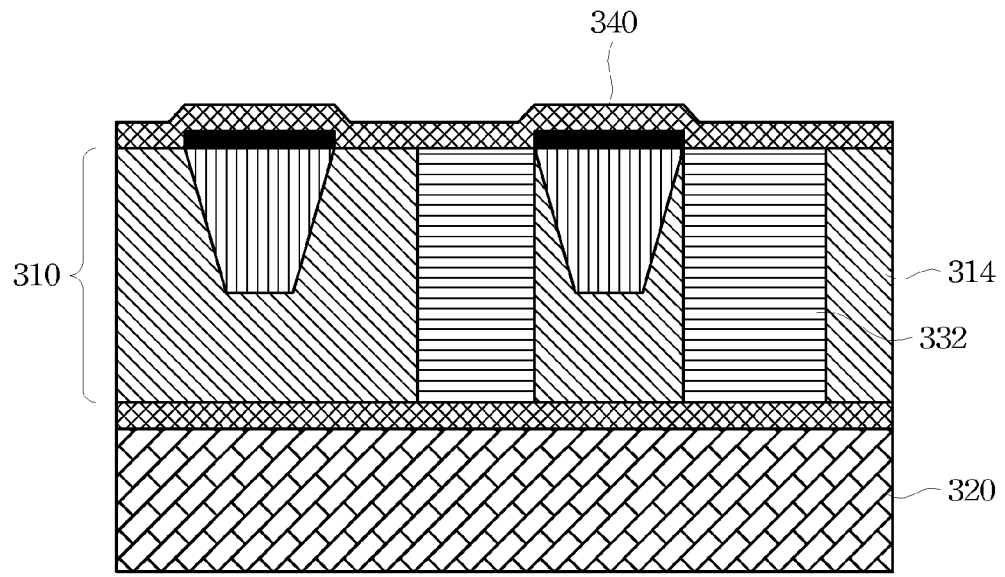
Figure 3F:
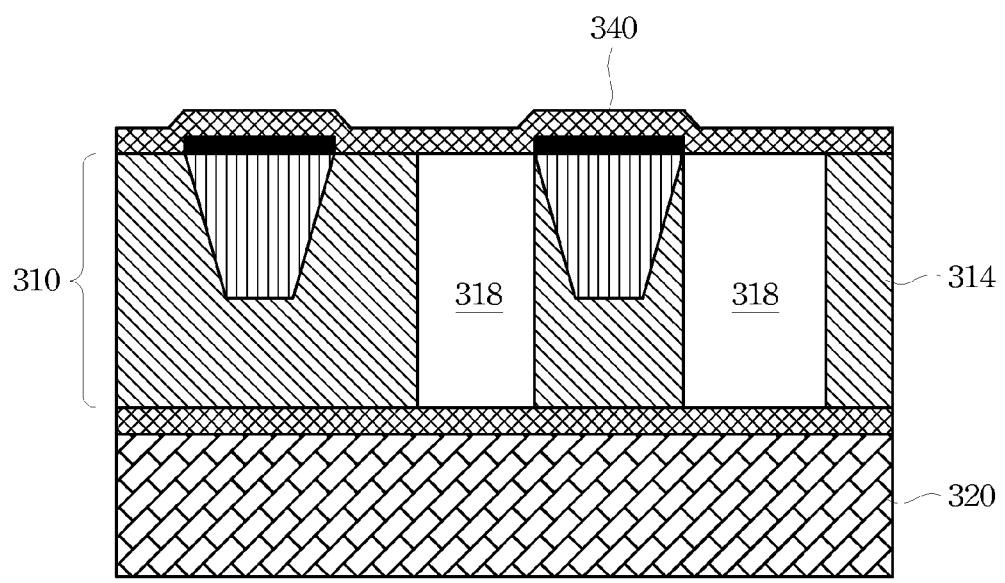

In FIG. 3E, a dielectric capping layer 340 is formed over the metal-containing layer 310. In one embodiment, the dielectric capping layer 340 is formed by depositing an etching stop layer on a top surface of the metal-containing layer 310 that includes the metal structure, the dielectric filler, and the TDP filler. Then in FIG. 3F, the TDP filler 332 is heated to cause decomposition of the TDP filler 332. As a result, the air-gap regions 318 previously filled with the TDP filler 332 are no longer filled with the TDP material. Because the TDP filler 332 is removed after depositing the dielectric capping layer 340, the air gap shape is that of the space occupied by the TDP filler 332. The top boundary of the air gap is the bottom surface of the dielectric capping layer, having a substantially flat profile. In some embodiments, the TDP filler 332 is heated at a temperature between 300° C. to 450° C., or between 350° C. to 420° C., depending on what TDP material is used. In other embodiments, the decomposition may be accomplished by localized heating, such as laser scanning of the air gap regions, or generalized heating, such as baking, plasma, pedestal heating, or radiative heating by exposing the semiconductor structure to infrared or ultraviolet radiation.

The temperature during the formation of the dielectric capping layer 340 should be carefully controlled to prevent a premature decomposition of the TDP filler 332. Further, in order to allow decomposed TDP filler 332 to escape from the semiconductor structure after the formation of the dielectric capping layer 340, dielectric capping layer 340 has a thickness between 5 nm and 50 nm. In some embodiments, the dielectric capping layer 340 has a thickness between 20 nm and 30 nm.

Figure 4A:
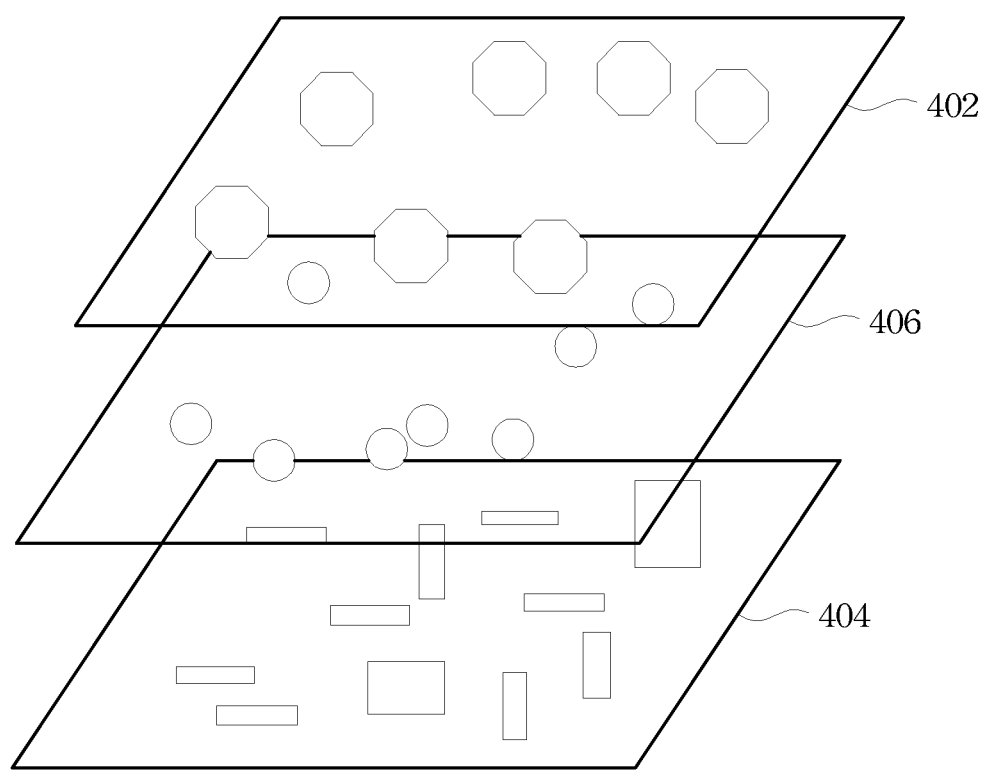
FIGS. 4A through 4C are perspective views of photomask patterns depicting a method of preparing a photomask containing an air-gap pattern for forming an air-gap region in a semiconductor device according to an embodiment.
Figure 4B:
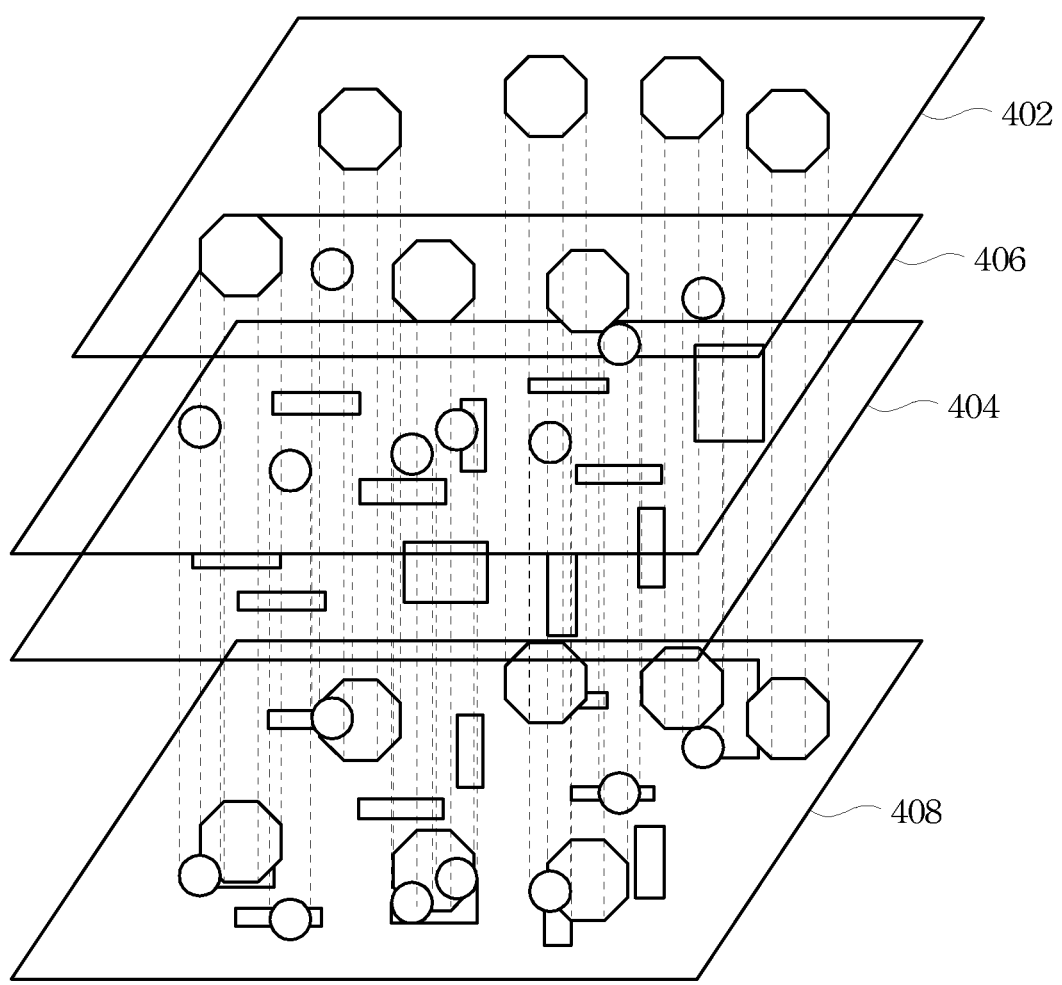
Figure 4C:
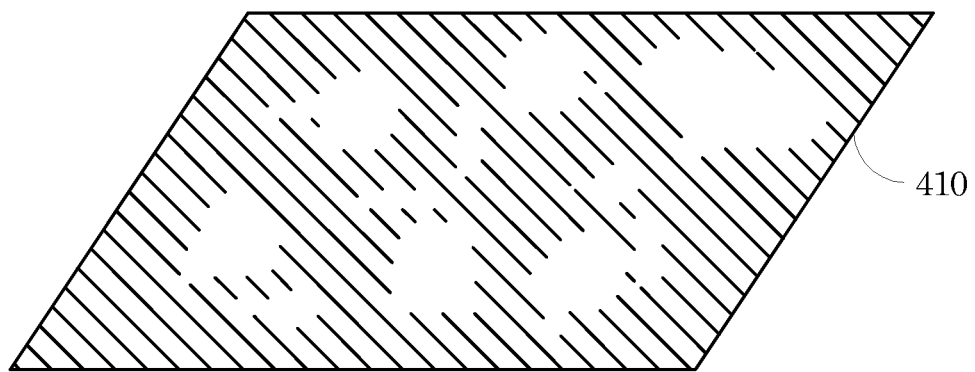

FIGS. 4A through 4C are perspective views of photomask patterns depicting a method of preparing a photomask containing an air-gap pattern for forming an air-gap region in a semiconductor device according to an embodiment.

Referring to FIG. 4A, a photomask 410 (FIG. 4C) containing an air-gap pattern for forming an air-gap region is prepared for forming the air-gap region in a metal-containing layer formed on a semiconductor device according to some embodiments. In order to ensure a better mechanical integrity of the semiconductor device, a pad pattern 402 corresponding to a set of conductive pads to be formed on the semiconductor device, a metal structure pattern 404 corresponding to a set of metal structures to be formed in the metal-containing layer, and a via pattern 406 corresponding to a set of via plugs to be formed in another metal-containing layer immediately above the metal-containing layer where the air-gap region to be formed are laid-out. Then the air-gap pattern can be derived according to the pad pattern, the via pattern, and the metal structure pattern.

Referring to FIG. 4B, the pad pattern, the via pattern, and the metal structure pattern are overlaid to form a superposed pattern 408, which refers to the areas that the formation of the air-gap region should be prevented according to some embodiments. Subsequently, the air-gap pattern on photomask 410 can be derived by inverting the superposed pattern 408. As such, the to-be-formed conductive pads and via plugs are not designed to overlap the air-gap regions.

In some embodiments, the air-gap region is intended to be formed to have at least a predetermined minimum horizontal distance from the via plugs and another predetermined minimum horizontal distance from the conductive pads in order to minimize the likelihood of overlapping the air-gap region with the via plugs and the conductive pads caused by mismatch of layers during manufacturing process. Therefore, the air-gap pattern is derived by extending peripherals of the pad pattern 402 outwardly by a first distance to obtain an extended pad pattern, extending peripherals of the via pattern 406 outwardly by a second distance to obtain an extended via pattern, and overlapping and inverting the extended pad pattern, the extended via pattern, and the metal structure pattern to obtain the air-gap pattern for the photomask 410. Preferably, the first distance is between 10 nm and 20 μm, or about 10 μm, and the second distance is between 0 nm and 50 nm or 5 nm and 50 nm.

In addition, the air-gap pattern can be further modified based on other factors such as penalty rules for the metal-containing layer or other restrictions or limitation of the manufacturing technology utilized. The actual air-gap pattern and the first and second horizontal distances used may also depend on other factors such as the size of the semiconductor device, the number of metal-containing layers, the strength of the low-k dielectric fillers, the RC constant of the semiconductor device required, the minimum thermal conductivity required, type of packaging, and sizes of components and devices. Generally, the larger the die size, the larger the second distance may be required to be, because a larger stress and strain caused by mismatch of coefficients of thermal expansion is expected between different materials. The number of metal-containing layers may affect the first horizontal distance as well because the probability of via plug mismatch increases with the number of metal-containing layers. Further, smaller first and second horizontal distances may be used when the low-k dielectric filler around the air-gap region has better mechanical characteristics. Also, different types of packaging technology cause different levels of stress. For example, stress and strain caused by thermal contraction for flip-chip packaging require different minimum horizontal distances from those required by impact stress of wire bond packaging technology.

In some embodiments based on a 40 nm manufacturing technology, the coverage ratio between an air-gap region and the combination of a dielectric filler/metal structures within a specific metal-containing layer is between 42% and 53%. In some other embodiments, although a lower effective dielectric constant and a larger coverage ratio up to about 64-71% can be achieved by reducing the minimum horizontal distance requirements, a yield rate of manufacturing process may decrease due to other factors such as those mentioned above. Therefore, the optimization of the yield rate should also be considered when determining the first and the second distance.

Although the embodiments have been described in detail, it should be understood that various changes, substitutions and alterations can be made. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a first metal-containing layer, comprising:
      a set of metal structures;
      a dielectric filler disposed to occupy a portion of the first metal-containing layer; and
      an air-gap region defined by at least the set of metal structures and the dielectric filler and abutting at least a portion of the set of metal structures;
   a dielectric capping layer formed over the first metal-containing layer;
   a second metal-containing layer formed over the dielectric capping layer, the second metal-containing layer comprising a via plug electrically connected to a portion of the set of metal structures, and the via plug not overlapping the air-gap region; and
   a conductive pad formed over the second metal-containing layer and not overlapping the air-gap region.

2. The semiconductor structure of claim 1, wherein a bottom surface of the dielectric capping layer defines a top boundary of the air-gap region, the top boundary has a substantially flat profile.

3. The semiconductor structure of claim 1, wherein the air-gap region and the conductive pad are separated by at least a first minimum horizontal distance.

4. The semiconductor structure of claim 3, wherein the first minimum horizontal distance is between 10 nm and 20 μm.

5. The semiconductor structure of claim 1, wherein the air-gap region and the via plug are separated by at least a second minimum horizontal distance.

6. The semiconductor structure of claim 5, wherein the second minimum horizontal distance is between 0 nm and 50 nm.

7. The semiconductor structure of claim 1, wherein the dielectric capping layer has a thickness between 5 nm and 50 nm.

8. The semiconductor structure of claim 1, further comprising:
   a metal capping layer between the set of metal structures and the dielectric capping layer.

9. The semiconductor structure of claim 8, wherein the metal capping layer comprises cobalt tungsten phosphide (CoWP).

10. A semiconductor structure comprising:
    a first metal-containing layer, comprising:
       a set of metal structures;
       a dielectric filler occupying a portion of the first metal-containing layer; and
       an air-gap region defined by at least the set of metal structures and the dielectric filler;
    a dielectric capping layer over the set of metal structures and the air-gap region;
    a second metal-containing layer formed over the dielectric capping layer, the second metal-containing layer comprising a via plug electrically connected to a portion of the set of metal structures, and the via plug not overlapping the air-gap region; and
    a conductive pad formed over the second metal-containing layer and not overlapping the air-gap region.

11. The semiconductor structure of claim 10, further comprising a protective layer between the set of metal structures and the air-gap region, wherein the protective layer is not uniform.

12. The semiconductor structure of claim 10, further comprising a metal capping layer between each of the set of metal structure and the dielectric capping layer.

13. The semiconductor structure of claim 10, wherein the air-gap region and the conductive pad are separated by at least a first minimum horizontal distance.

14. The semiconductor structure of claim 10, wherein the air-gap region and the via plug are separated by at least a second minimum horizontal distance.

15. The semiconductor structure of claim 11, wherein the air-gap region abuts at least a portion of the set of metal structures.

16. A semiconductor structure comprising:
    a first metal-containing layer, comprising:
       a first set of metal structures;
       a first dielectric filler occupying a portion of the first metal-containing layer; and
       a first air-gap region defined by at least the set of metal structures and the dielectric filler;
    a second metal-containing layer, comprising:
       a second set of metal structures;
       a second dielectric filler occupying a portion of the first metal-containing layer; and
       a second air-gap region defined by at least the set of metal structures and the dielectric filler, wherein the second air-gap region is disposed above the first air-gap region;
    a first via plug electrically connected to a portion of the first set of metal structures;
    a dielectric capping layer between the first metal-containing layer and the second metal-containing layer; and
    a conductive pad over the second metal-containing layer and not overlapping the first or second air-gap region.

17. The semiconductor structure of claim 16, further comprising a metal capping layer between each of the first set of metal structure and the dielectric capping layer.

18. The semiconductor structure of claim 16, wherein the first air-gap region abuts at least a portion of the first set of metal structures.

19. The semiconductor structure of claim 16, wherein the first and second air-gap regions and the conductive pad are separated by at least a first minimum horizontal distance, and the first air-gap region and the first via plug are separated by at least a second minimum horizontal distance.

20. The semiconductor structure of claim 19, further comprising a second via plug electrically connected to a portion of the second set of metal structures, the second air-gap region and the second via plug are separated by at least a third minimum horizontal distance less than the second minimum distance.

* * * * *